United States Patent
Kang et al.

(10) Patent No.: US 8,890,325 B2
(45) Date of Patent: Nov. 18, 2014

(54) HETEROJUNCTION STRUCTURES OF DIFFERENT SUBSTRATES JOINED AND METHODS OF FABRICATING THE SAME

(75) Inventors: Un-Byoung Kang, Hwaseong-si (KR);
Kwang-chul Choi, Suwon-si (KR);
Jung-Hwan Kim, Gyeonggi-do (KR);
Tae Hong Min, Gumi-si (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 13/244,544

(22) Filed: Sep. 25, 2011

(65) Prior Publication Data
US 2012/0168792 A1    Jul. 5, 2012

(30) Foreign Application Priority Data

Dec. 31, 2010  (KR) .......................... 10-2010-0139992

(51) Int. Cl.
*H01L 23/48*   (2006.01)
*H01L 33/48*   (2010.01)
*H01L 33/62*   (2010.01)
*H01L 33/00*   (2010.01)

(52) U.S. Cl.
CPC ........... *H01L 33/486* (2013.01); *H01L 2224/16* (2013.01); *H01L 33/62* (2013.01); *H01L 33/0079* (2013.01); *H01L 2933/0066* (2013.01)
USPC ...................... 257/774; 257/99; 257/E21.577

(58) Field of Classification Search
CPC ... H01L 33/486; H01L 33/0079; H01L 33/62; H01L 2933/0066
USPC ................... 257/774–775, 782–783, 777, 99, 257/E21.577; 438/455
See application file for complete search history.

(56) References Cited

U.S. PATENT DOCUMENTS

| | | | |
|---|---|---|---|
| 6,864,172 B2 * | 3/2005 | Noma et al. | 438/674 |
| 7,626,258 B2 | 12/2009 | Lim et al. | |
| 7,772,118 B2 * | 8/2010 | Yamano | 438/667 |
| 2007/0284602 A1 * | 12/2007 | Chitnis et al. | 257/98 |
| 2008/0210955 A1 | 9/2008 | Uemura et al. | |
| 2010/0124798 A1 | 5/2010 | Kim et al. | |

FOREIGN PATENT DOCUMENTS

| | | |
|---|---|---|
| JP | 2008-186959 | 8/2008 |
| KR | 100750741 B1 | 8/2007 |
| KR | 1020100055867 A | 5/2010 |

\* cited by examiner

*Primary Examiner* — Jose R Diaz
(74) *Attorney, Agent, or Firm* — Renaissance IP Law Group LLP

(57) ABSTRACT

In one embodiment, a heterojunction structure includes a first substrate; a second substrate comprising an electrode pad, the second substrate joined to the first substrate by an adhesive layer interposed between the first and second substrates, the first substrate and the adhesive layer having a via hole penetrating therethrough to expose a region of the electrode pad; a connection electrode disposed in the via hole and contacting the electrode pad; and an insulation layer electrically insulating the connection electrode from the first substrate. One of the first and second substrates has a thermal expansion coefficient different than a thermal expansion coefficient of the other of the first and second substrates, and at least one of the adhesive layer or the insulation layer comprises an organic material.

18 Claims, 16 Drawing Sheets

HETEROJUNCTION STRUCTURES OF DIFFERENT SUBSTRATES JOINED AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2010-0139992, filed on Dec. 31, 2010, the entire contents of which are hereby incorporated by reference.

BACKGROUND

The present disclosure herein relates to a semiconductor, and more particularly, to heterojunction structures of different substrates and methods of fabricating the same.

A junction technology that can join substrates of different materials is useful in the field of digital appliances for their miniaturization and high functionality. In joining the substrates of different materials, however, the substrates can be delaminated, bent, and/or cracked due to stresses resulting from differences in the coefficients of thermal expansion between the substrates. Therefore, a novel junction technology may be needed for decreasing an error rate in the fabrication of electronic devices and for increasing yield.

SUMMARY

The present disclosure provides improved heterojunction structures of different substrates and methods of fabricating the same.

In one embodiment, a heterojunction structure includes a first substrate; a second substrate comprising an electrode pad, the second substrate joined to the first substrate by an adhesive layer interposed between the first and second substrates, the first substrate and the adhesive layer having a via hole penetrating therethrough to expose a region of the electrode pad; a connection electrode disposed in the via hole and contacting the electrode pad; and an insulation layer electrically insulating the connection electrode from the first substrate. One of the first and second substrates has a thermal expansion coefficient different than a thermal expansion coefficient of the other of the first and second substrates, and at least one of the adhesive layer or the insulation layer comprises an organic material.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
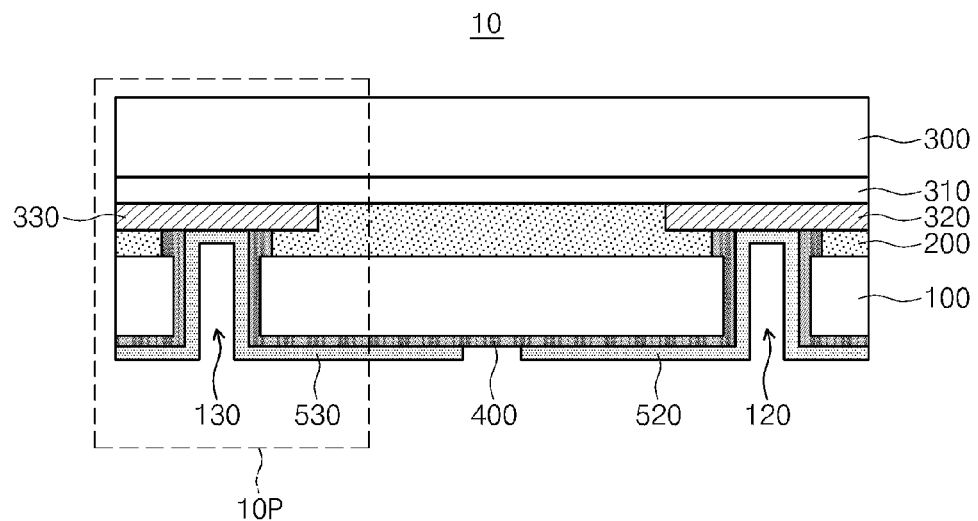
FIG. 1A is a cross-sectional view illustrating a heterojunction structure of different substrates according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Advantages of the inventive concept in comparison with the related art will be clarified through the Detailed Description of Preferred Embodiments and the Claims with reference to the accompanying drawings. In particular, the inventive concept is well pointed out and clearly claimed in the Claims. The inventive concept, however, may be best appreciated by referring to the following Detailed Description of Preferred Embodiments with reference to the accompanying drawings. In the drawings, like reference numerals refer to like elements throughout.

Hereinafter, heterojunction structures of different substrates and methods of fabricating the same according to embodiments of the inventive concept will be described in detail with reference to the accompanying drawings.

Example of Heterojunction Structures of Different Substrates

Figure 1B:
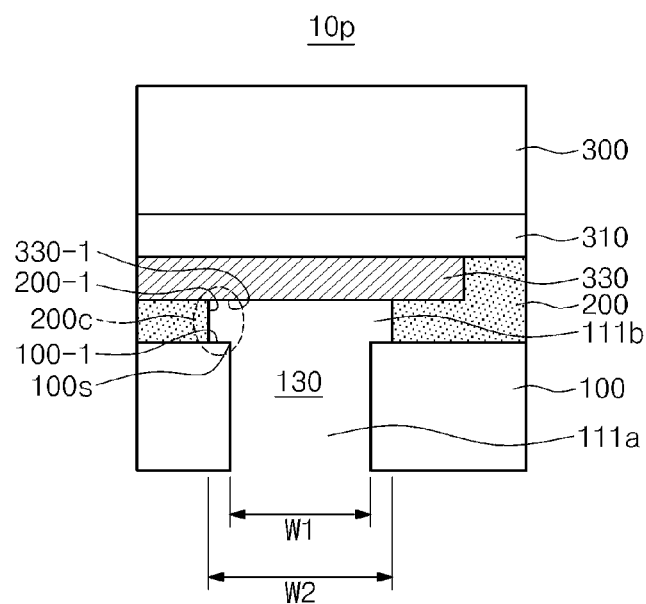
FIG. 1B is a cross-sectional view illustrating an enlarged portion of FIG. 1A.

FIG. 1A is a cross-sectional view illustrating a heterojunction structure of different substrates according to an embodiment of the inventive concept. FIG. 1B is a cross-sectional view illustrating an enlarged portion of FIG. 1A.

Referring to FIG. 1A, a heterojunction structure 10 according to an embodiment of the inventive concept may include a first substrate 100, a second substrate 300 formed of a material different from that of the first substrate 100, and an adhesive layer 200 joining the first and second substrates 100 and 300. In some embodiments, the second substrate 300 may have a luminous layer 310 formed thereon described below. The luminous layer 310 may include an electroluminescent material. In the heterojunction structure 10, the first and second substrates 100 and 300 may be joined by the adhesive layer 200, connection electrodes 520 and 530 on the first substrate 100 may be respectively connected to electrode pads 320 and 330 on the second substrate 300, and thus the first and second substrates 100 and 300 may be electrically connected to each other.

The first and second substrates 100 and 300 may be formed of different materials having different coefficients of thermal expansion (CTE), respectively. For example, the first substrate 100 may be a silicon (Si) substrate having a thermal expansion coefficient of about 2.60 ppm/K, and the second substrate 300 may be a sapphire ($Al_2O_3$) substrate having a thermal expansion coefficient of about 7.50 ppm/K. In the specification, the first substrate 100 may be referred to as a silicon substrate, and the second substrate 300 may be referred to as a sapphire substrate. In the specification, a junction structure formed by the silicon substrate 100 and sapphire substrate 300 will be described below. However, the junction structure discussed in the specification is merely one example and the materials of the substrates 100 and 300 are not limited to Si and $Al_2O_3$, and all other suitable materials having different coefficients of thermal expansion may be applied to the inventive concept.

The sapphire substrate 300 may be provided for fabricating any luminous or electroluminescent devices such as a Light Emitting Diode (LED). The silicon substrate 100 may be provided for fabricating an interposer. The first and second substrates 100 and 300 may be a wafer level substrate (i.e., the substrate itself is a wafer without being singulated) or a chip level substrate (i.e., the substrate is a chip singulated from a wafer). Alternatively, one of the first and second substrates 100 and 300 may be a wafer level substrate, and the other may be a chip level substrate. The sapphire substrate 300 may be provided for growing the light emitting layer or luminous layer 310 thereon. The luminous layer 310 may include a compound semiconductor or a circuit that forms a light emitting device. The luminous layer 310, for example, may include GaN that may be used to fabricate a blue LED. The sapphire substrate 300 may include the electrode pads 320 and 330 on the luminous layer 310. The first electrode pad 320 may be an N electrode pad and the second electrode 330 may be a P electrode pad, or vice versa.

The silicon substrate 100 may include the first and second connection electrodes 520 and 530 that are respectively connected to the first and second electrode pads 320 and 330. The first and second connection electrodes 520 and 530 may be respectively extended into first and second via holes 120 and 130 that respectively expose the first and second electrode pads 320 and 330. The first and second via holes 120 and 130 may penetrates through the silicon substrate 100 and at least a portion of the adhesive layer 200. The silicon substrate 100 may include an insulation layer 400 that electrically insulates the silicon substrate 100 from the first and second connection electrodes 520 and 530. The insulation layer 400 may be formed of an inorganic material such as oxide, oxynitride or nitride. Alternatively, the insulation layer 400 may be formed of an organic material such as polymer.

When the substrates 100 and 300 are respectively made of different materials, the substrates 100 and 300 may be detached from each other, and/or warpage where the heterojunction structure 10 is bent may occur, due to differences in coefficients of thermal expansion (CTE) between the substrates 100 and 300. The adhesive layer 200 may be formed of any material which can relieve or help reduce thermal stresses induced on the heterojunction structure 10, resulting from differences in CTE between the substrates 100 and 300, and/or stably join the substrates 100 and 300.

According to an embodiment of the inventive concept, the adhesive layer 200 may be an organic material that has relatively better or higher elasticity and/or lower modulus of elasticity than that of an inorganic material. For example, the adhesive layer 200 may be polymer such as silicon-based resin (e.g., siloxane). When the adhesive layer 200 is formed of an organic material, a stress resulting from the differences in thermal expansion coefficients between the substrates 100 and 300 may be alleviated. Furthermore, some additional benefits can be obtained, illustrated in detail later with reference to FIG. 1B, which shows an enlarged portion 10p of the heterojunction structure 10.

Referring to FIGS. 1A and 1B, the second via hole 130 may be formed using a dry etching process or a laser drilling process. In this case, an under-cut region 200c may be formed in the adhesive layer 200, where the undercut region 200c may be collectively defined by a sidewall 200-1 of the adhesive layer 200, a top surface 100-1 of the silicon substrate 100 and a lower surface 330-1 of the electrodes 320 or 330. Therefore, the second via hole 130 may include a first sub-via hole 111a having a first width W1 extending through the silicon substrate 100 and a second sub-via hole 111b in communication with the first hole 111a and extending through a portion of the adhesive layer 200. The second sub-via hole 111b has a second width W2 greater than the first width W1. In other words, the second via hole 130 may extend further into a portion of the adhesive layer 200 over the top surface 100-1 of the substrate 100.

In general, when the insulation layer 400 is formed by depositing an inorganic material into the second via hole 130 in a deposition process, the insulation layer 400 may be inadequately formed in an under-cut region 200c, for example, at a region near the sharp edge 100s. The under-cut region 200c may undesirably expose a sharp edge portion 100s of the silicon substrate 100. The sharp edge 100s that is not well covered by the insulation layer 400 may serve as a source of a leakage current. When the insulation layer 400 is formed of an inorganic material, adhesive strength to the adhesive layer 200 of an organic material may be weak. Alternatively, when the insulation layer 400 is formed of an organic material, the above-described limitations cannot occur.

According to one embodiment of the inventive concept, the insulation layer 400 may be formed of an organic material in a spin or spray coating process. Accordingly, the insulation layer 400 may fill the under-cut region 200c substantially completely and sufficiently surround the sharp edge 100s.

The heterojunction structure 10 may be formed in various ways. One or more modified examples of the heterojunction structure 10 will be described later with respect to methods of fabricating the heterojunction structure of different substrates.

Example of Light Emitting Device Package

Figure 1C:
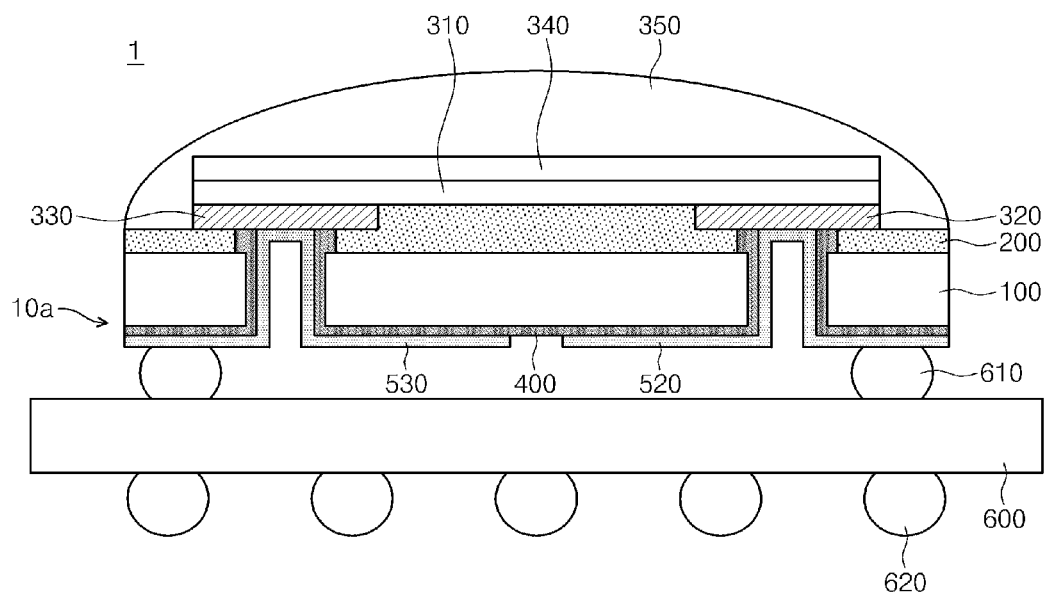
FIG. 1C is a cross-sectional view illustrating a light emitting device package using a heterojunction structure of different substrates, according to an embodiment of the inventive concept.

FIG. 1C is a cross-sectional view illustrating a light emitting device package using a heterojunction structure of different substrates, according to an embodiment of the inventive concept.

Referring to FIG. 1C, a light emitting device package 1 may be an LED or other electroluminescent device where the sapphire substrate 300 (see FIG. 1A) is removed from the heterojunction structure 10 (see FIG. 1A) and a light emitting device chip (or any other suitable electroluminescent device chip) 10a may be electrically connected to a package substrate 600 such as a Printed Circuit Board (PCB) through, for example, flip chip technologies using a solder ball 610. The light emitting device package 1 may further include a molding layer 350 encapsulating the light emitting device chip 10a.

The molding layer 350 may be formed of transparent epoxy or silicon resin in a lens shape. The light emitting device package 1 may further include a fluorescent layer 340 formed on the luminous layer 310. The light emitting device package 1 may further include a plurality of external terminals 620 such as solder balls adhered to the PCB 600. According to an embodiment of the inventive concept, the light emitting device chip 10a may be formed having a heterojunction structure 10 that is not bent or delaminated, and thus, a light emitting device package 1 can be manufactured having excellent mechanical and electric characteristics.

One skilled in the art will appreciate that other arrangements may also be possible. For example, the molding layer 350 may be spaced apart from the luminous layer 10 or the fluorescent layer 340 and have a space therebetween. Also, the light emitting device chip 10a may be coupled to the package substrate 600 through other interconnection technologies such as Anisotropic Conductive Film (ACF) or wire bonding.

Figure 1D:
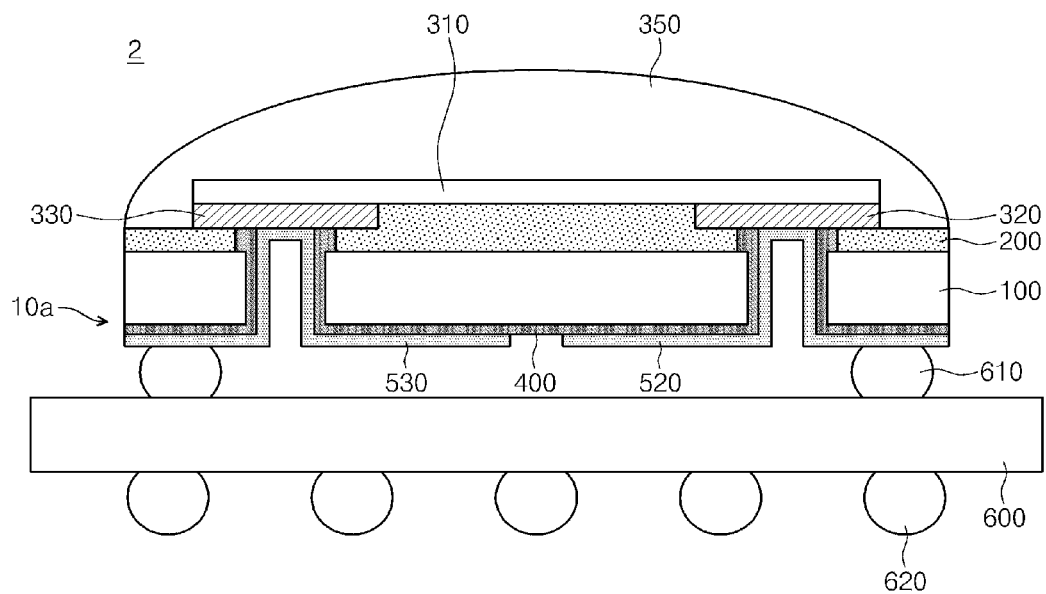
FIG. 1D is a cross-sectional view illustrating a light emitting device package according to another embodiment of the inventive concept.

FIG. 1D is a cross-sectional view illustrating a light emitting device package, according to another embodiment of the inventive concept. The light emitting device package 2 shown in FIG. 1D is similar to that shown in FIG. 1C except that the fluorescent layer 340 is omitted. Instead, a phosphor material may be substantially uniformly dispersed in the molding layer 350.

Example of Method of Fabricating Heterojunction Structure of Different Substrates FIGS. 2A to 2E are cross-sectional views illustrating a method of fabricating a heterojunction structure of different substrates, according to an embodiment of the inventive concept.

Figure 2A:
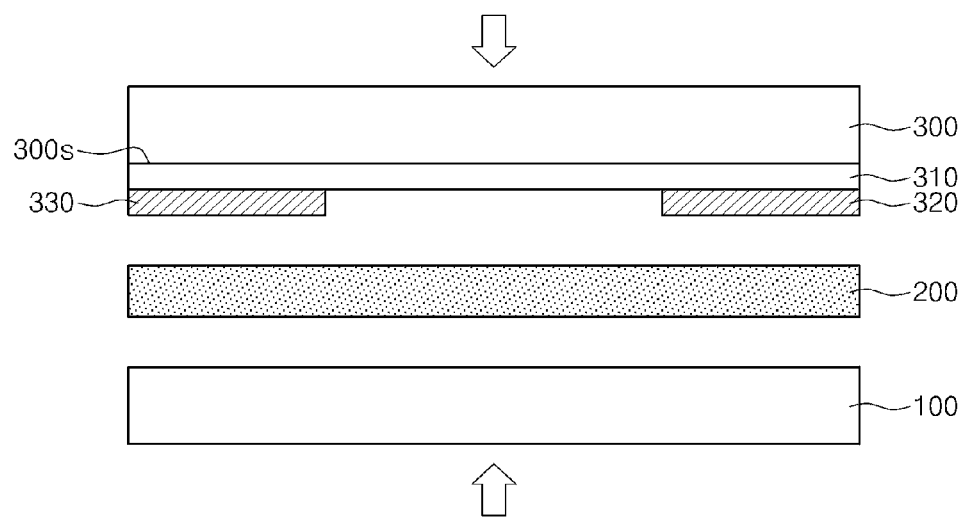
FIGS. 2A to 2E are cross-sectional views illustrating a method of fabricating a heterojunction structure of different substrates, according to an embodiment of the inventive concept.

Referring to FIG. 2A, a silicon substrate 100 and a sapphire substrate 300 may be coupled by an adhesive layer 200. A luminous layer 310 may be formed on a surface 300s of the sapphire substrate 300 facing the silicon substrate 100, and first and second electrode pads 320 and 330 may be formed on the luminous layer 310. For example, the adhesive layer 200 may be formed of polymer such as silicon-based resin (for example, siloxane). The silicon substrate 100 and the sapphire substrate 300 may be a wafer level substrate. The luminous layer 310 may include a circuit that forms a light emitting device or a compound semiconductor, for example, GaN that may be used to fabricate a blue LED.

Figure 2B:
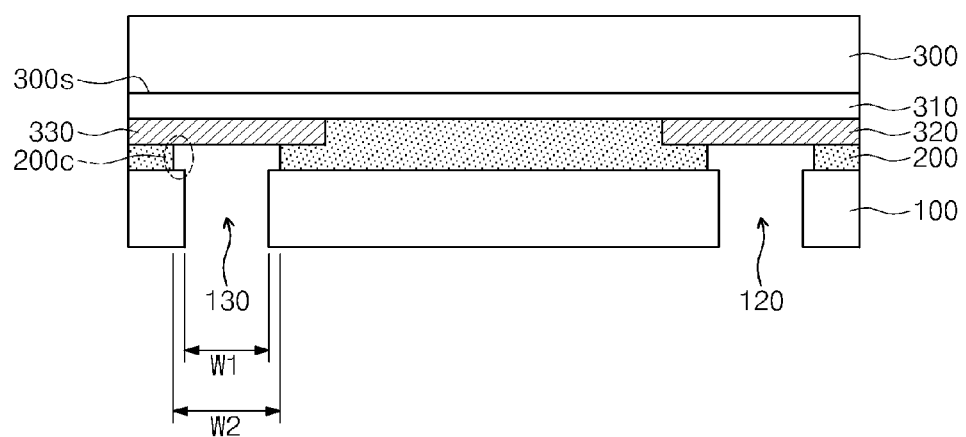

Referring to FIG. 2B, first and second via holes 120 and 130 that respectively expose the first and second electrode pads 320 and 330 through the silicon substrate 100 and the adhesive layer 200 may be formed. The first and second via holes 120 and 130 may be formed in, for example, a wet or dry etching process. When the first and second via holes 120 and 130 are formed, an undercut region 200c described above with respect to FIG. 1B may be formed in the adhesive layer 200. Therefore, each of the first and second via holes 120 and 130 may have a first width W1, in a region of the silicon substrate 100 and have a second width W2 greater than the first width W1, in a region of the adhesive layer 200.

Figure 2C:
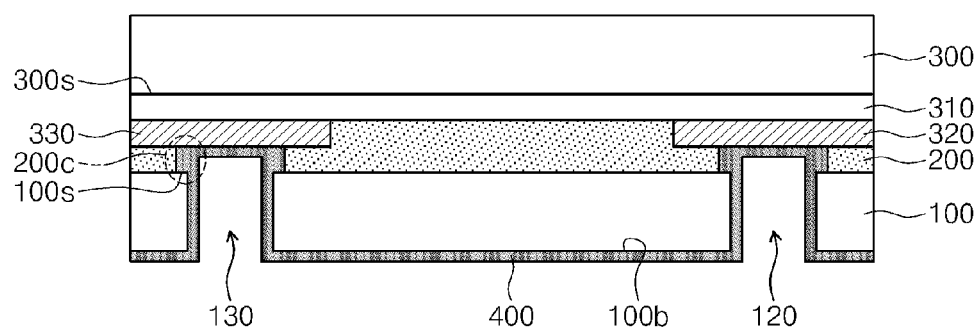

Referring to FIG. 2C, an insulation layer 400 may be formed. The insulation layer 400 may be formed of an inorganic material such as oxide, oxynitride, or nitride. Alternatively, the insulation layer 400 may be formed of an organic material such as polymer. The insulation layer 400 may be formed by providing silicon-based resin, identical or similar to that of the adhesive layer 200, to a lower surface 100b of the silicon substrate 100 in a spin coating or spray coating process. According to an embodiment of the inventive concept, as described above with reference to FIG. 1B, the insulation layer 400 may sufficiently coat both the under-cut region 200c and the sharp edge 100s of the silicon substrate 100. Also, in some embodiments, the insulation layer 400 and the adhesive layer 200 may be formed of the same material or similar materials. In this case, good interface adhesive strength can be obtained. The insulation layer 400 may have a shape that covers inner walls of the first and second via holes 120 and 130 and the lower surface 100b of the silicon substrate 100.

Figure 2D:
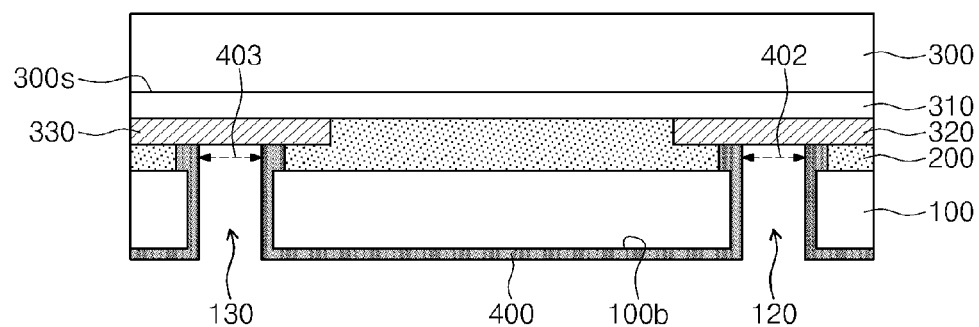

Referring to FIG. 2D, the first and second electrode pads 320 and 330 may be exposed by removing portions of the insulation layer 400. For example, a first opening 402 exposing a region of the first electrode pad 320 and a second opening 403 exposing a region of the second electrode pad 330 may be formed by etching portions of the insulation layer 400 using, for example, a dry etching process. The insulation layer 400 may have a shape that covers the inner walls of the first and second via holes 120 and 130 and the lower surface 100b of the silicon substrate 100, and exposes regions of the first and second electrode pads 320 and 330.

Figure 2E:
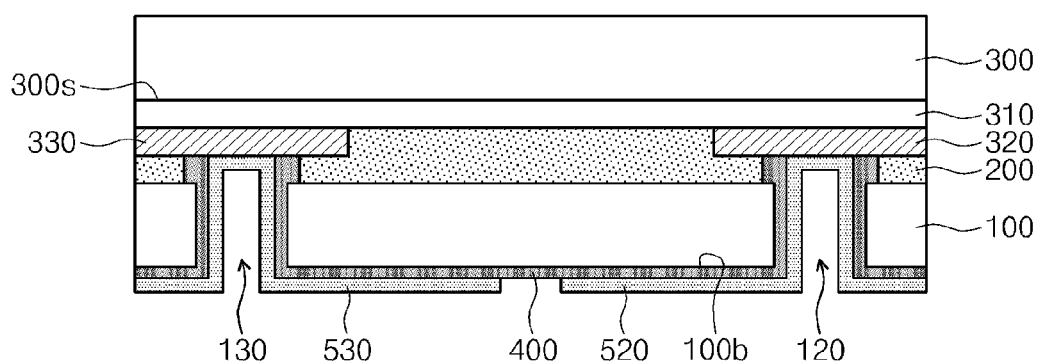

Referring to FIG. 2E, first and second connection electrodes 520 and 530 that are respectively connected to the first and second electrode pads 320 and 330 may be formed. For example, a metal layer may be formed in an electroplating process, an electro-less plating process, a chemical vapor deposition process, or a physical vapor deposition process. Then, the first connection electrode 520 connected to the first electrode pad 320 and the second connection electrode 530 connected to the second electrode pad 330 may be formed by patterning the metal layer. When the first and second connection electrodes 520 and 530 are formed in an electroplating process, the first and second electrode pads 320 and 330 may be used as an electroplating seed layer or further form a seed layer. The first connection electrode 520 may directly contact the first electrode pad 320 in the first via hole 120, the second connection electrode 530 may directly contact the second electrode pad 330 in the second via hole 130. The first and second electrode 520, 530 may extend to the lower surface 100b of the silicon substrate 100. According to the above-described processes, the sapphire substrate 100 and silicon substrate 300 having different coefficients of thermal expansion may be joined by the adhesive layer 200 of an organic material, and thus, provided may be the heterojunction structure 10 where adhesive strength does not become weak due to a thermal expansion coefficient, and warpage does not occur or is substantially reduced. The heterojunction structure 10 may be fabricated at a wafer level. The heterojunction structure 10, as described below, may be usefully used to fabricate a light emitting device.

Example of Method of Fabricating Light Emitting Device Package

Figure 3A:
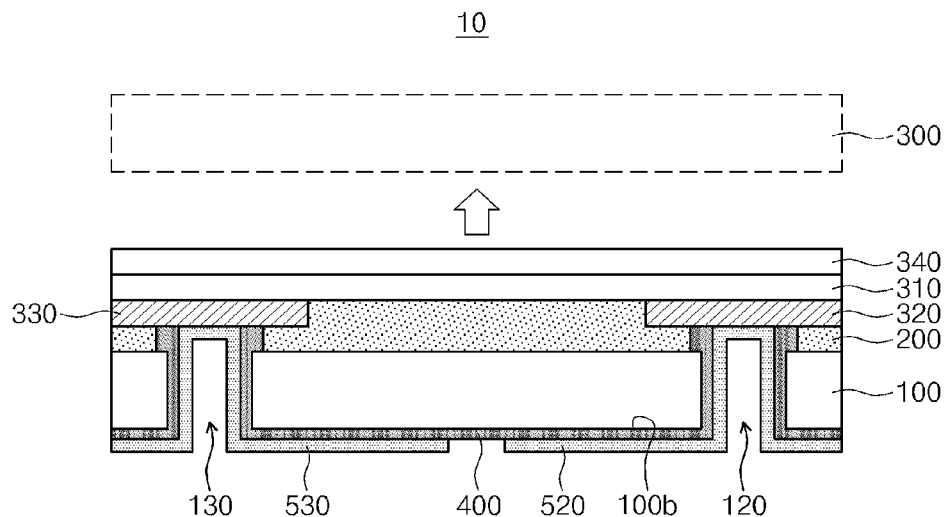
FIGS. 3A to 3C are cross-sectional views illustrating a method of fabricating a heterojunction structure of different substrates, according to an embodiment of the inventive concept.
Figure 3B:
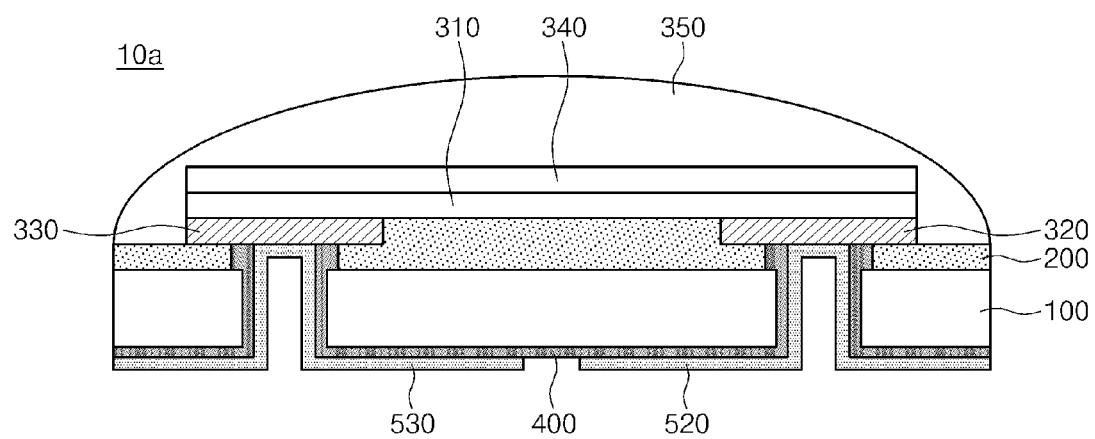
Figure 3C:
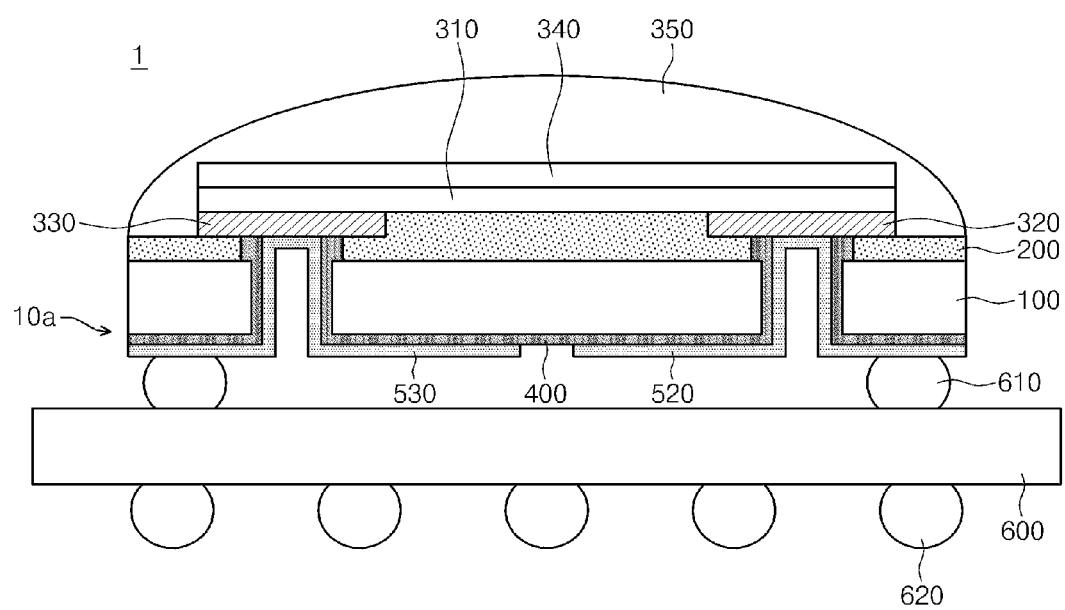

FIGS. 3A to 3C are cross-sectional views illustrating a method of fabricating a heterojunction structure of different substrates, according to an embodiment of the inventive concept.

Referring to FIG. 3A, the sapphire substrate 300 may be removed from the heterojunction structure 100 that is fabricated in the above-described processes of FIGS. 2A to 2E. Optionally, the fluorescent layer 340 may be further formed on the light emission layer 310. The fluorescent layer 340, for example, may be formed of a yellow fluorescent substance. The fluorescent layer 340 including the yellow fluorescent substance can make a white LED of a blue LED.

Referring to FIG. 3B, the molding layer 350 may be formed on the silicon substrate 100. The molding layer 350 may be formed of transparent epoxy or silicon resin in a lens shape that surrounds the fluorescent layer 340 and the luminous layer 310. In some embodiments, there may be provided a light emitting device chip 10a of a waver level where the luminous layer 310 and the fluorescent layer 340 are stacked on the silicon substrate 100. The light emitting device chip 10a of a wafer level may be divided into a plurality of chip levels by sawing the light emitting device chip 10a of a wafer level along a scribe lane.

Referring to FIG. 3C, the light emitting device chip 10a may be packaged. As an example, by flip chip-bonding the light emitting device chip 10a on the package substrate 600 by using, for example, the solder ball 610, the light emitting device package 1 may be formed. The external terminals 620 for connecting the light emitting device package 1 to an external electric device may be attached to the package substrate 600.

Figure 4A:
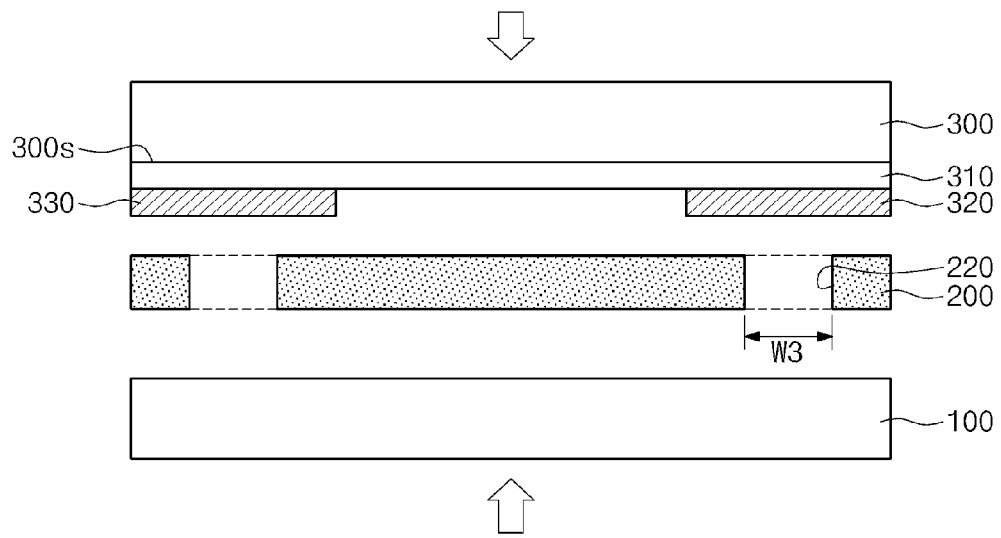
FIGS. 4A to 4C are cross-sectional views illustrating a method of fabricating a heterojunction structure of different substrates, according to another embodiment of the inventive concept.
Figure 4B:
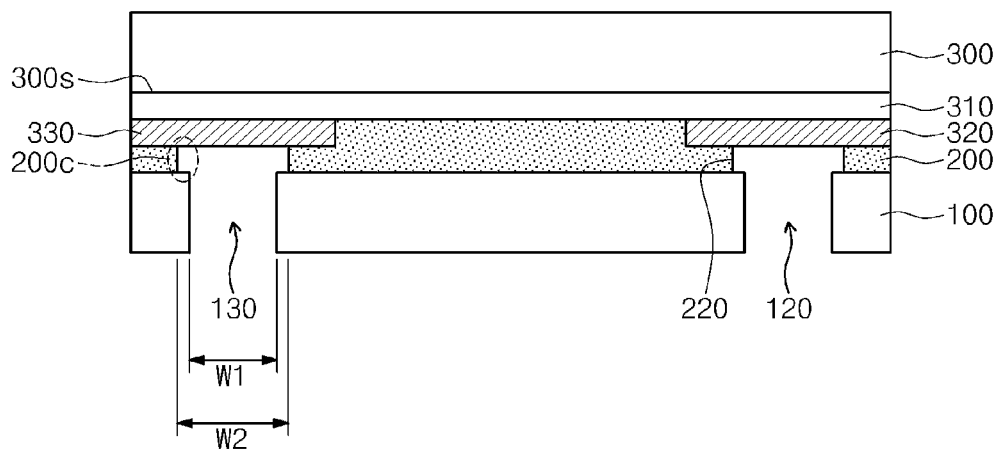
Figure 4C:
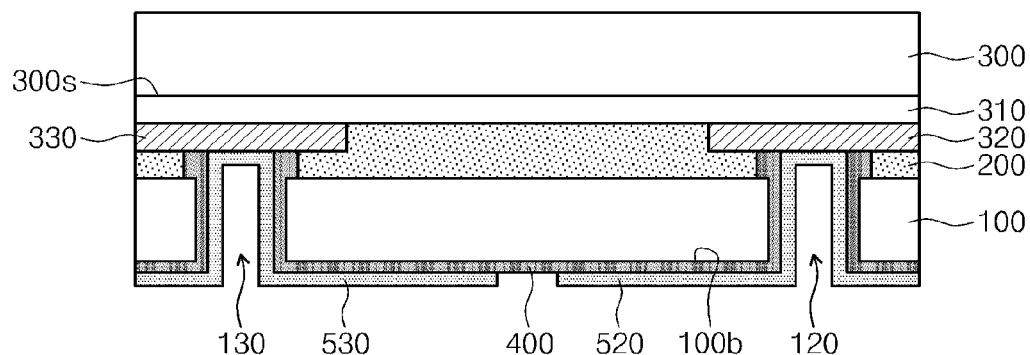

Modification 1 of Method of Fabricating Heterojunction Structure of Different Substrates FIGS. 4A to 4C are cross-sectional views illustrating a method of fabricating a heterojunction structure of different substrates, according to an embodiment of the inventive concept.

Referring to FIG. 4A, a silicon substrate 100 and a sapphire substrate 300 may be joined by an adhesive layer 200 of an organic material. The adhesive layer 200 may be patterned to have a plurality of through holes 220 having a third width W3 that are aligned with first and second electrode pads 320 and 330. A luminous layer 310 may be formed on a surface 300s of the sapphire substrate 300, and the first and second electrode pads 320 and 330 may be formed on the luminous layer 310.

Referring to FIG. 4B, first and second via holes 120 and 130 may be formed through the silicon substrate 100 to be connected to the through holes 220 and expose the first and second electrode pads 320 and 330. The first and second via holes 120 and 130 may be formed in a wet or dry etching process. An etchant may react with the adhesive layer 200 during the etching process, and thus, an under-cut region 200c may be formed in the adhesive layer 200. Due to the under-cut region 200c of the adhesive layer 200, each of the first and second via holes 120 and 130 may have the first width W1, in a region of the silicon substrate 100 and also have the second width W2 greater than the first width W1, in a region of the adhesive layer 200. According to this, the through hole 220 may be extended to the second width W2 greater than the third width W3. The third width W3 may be equal to, greater than, or less than the first width W1.

Referring to FIG. 4C, an insulation layer 400 may be formed of an organic material. The insulation layer 400 may cover side walls of the first and second via holes 120 and 130 and a lower surface 100b of the silicon substrate 100 and expose portions of the first and second electrode pads 320 and 330. Subsequently, first and second connection electrodes 520 and 530 may be formed to be contacted to the exposed first and second electrode pads 320 and 330. The first and second connection electrodes 520 and 530 may be extended to the lower surface 100b of the silicon substrate 100. Therefore, there may be provided a heterojunction structure 11 of different substrates where the sapphire substrate 300 and silicon substrate 100 having different thermal expansion coefficients are joined by the adhesive layer 200 of an organic material. Except that the patterned adhesive layer 200 is applied, the heterojunction structure 11 of different substrates according to another embodiment of the inventive concept may be the substantially same as the heterojunction structure 10 of FIG. 2E.

Figure 5A:
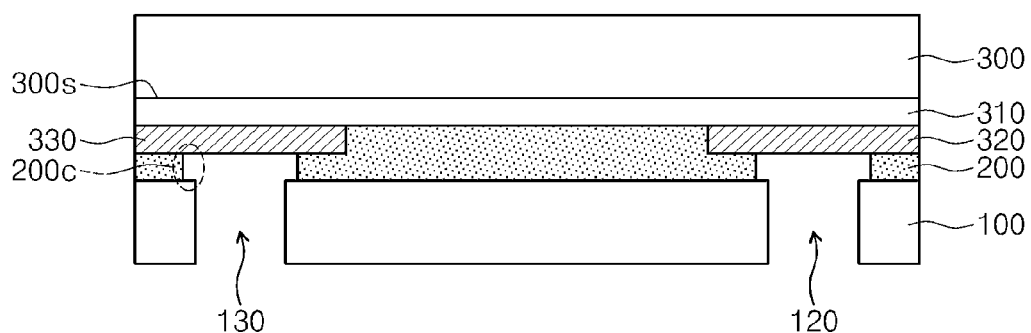
FIGS. 5A to 5C are cross-sectional views illustrating a method of fabricating a heterojunction structure of different substrates, according to another embodiment of the inventive concept.
Figure 5B:
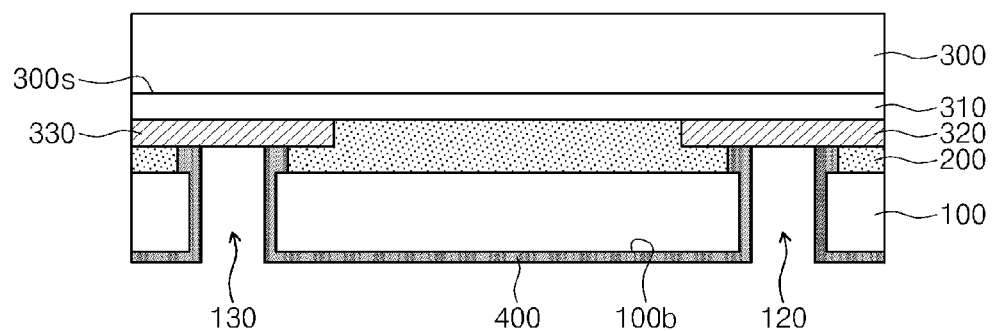
Figure 5C:
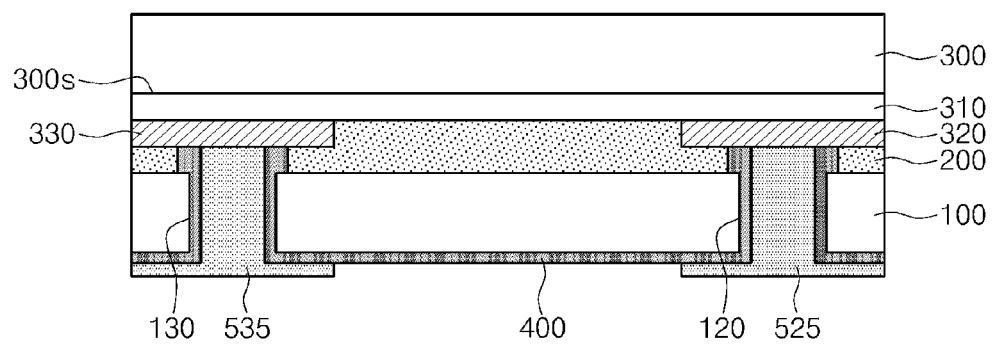

Modification 2 of Method of Fabricating Heterojunction Structure of Different Substrates FIGS. 5A to 5C are cross-sectional views illustrating a method of fabricating a heterojunction structure of different substrates, according to an embodiment of the inventive concept.

Referring to FIG. 5A, a silicon substrate 100 and a sapphire substrate 300 may be joined with an adhesive layer 200 of an organic material. First and second via holes 120 and 130 may be formed. The first and second via holes 120 and 130 may penetrate through the silicon substrate 100 and portions of the adhesive layer 200 to expose regions of first and second electrodes pads 320 and 330, respectively, on a surface 300s of the sapphire substrate 300. The adhesive layer 200, as illustrated in FIG. 2A, may have a bulk shape, or a patterned shape to have the through hole 220 as in FIG. 4A. The adhesive layer 200 may have an under-cut region 200c formed therein. The under-cut region 200c may be formed in an etching processing for forming first and second via holes 120 and 130.

Referring to FIG. 5B, an insulation layer 400 may be formed of an organic material. The insulation layer 400 may cover side walls of the first and second via holes 120 and 130 and a lower surface 100b of the silicon substrate 100 and expose the first and second electrode pads 320 and 330. The insulation layer 400 may be formed by coating and patterning an organic material.

Referring to FIG. 5C, first and second connection electrodes 525 and 535 may be formed to fill the first and second via holes 120 and 130. The first and second connection electrodes 525 and 535 may contact the first and second electrode pads 320 and 330, respectively. Unlike other embodiments, the first and second connection electrodes 525 and 535 may be formed in a pillar shape equal or similar to a Through Silicon Via (TSV). According to some embodiments, there may be provided a heterojunction structure 12 of different substrates where the sapphire substrate 300 and silicon substrate 100 having different thermal expansion coefficients are joined by the adhesive layer 200 of an organic material. The heterojunction structure 12 may include the first and second connection electrodes 525 and 535 having a TSV shape.

Figure 6A:
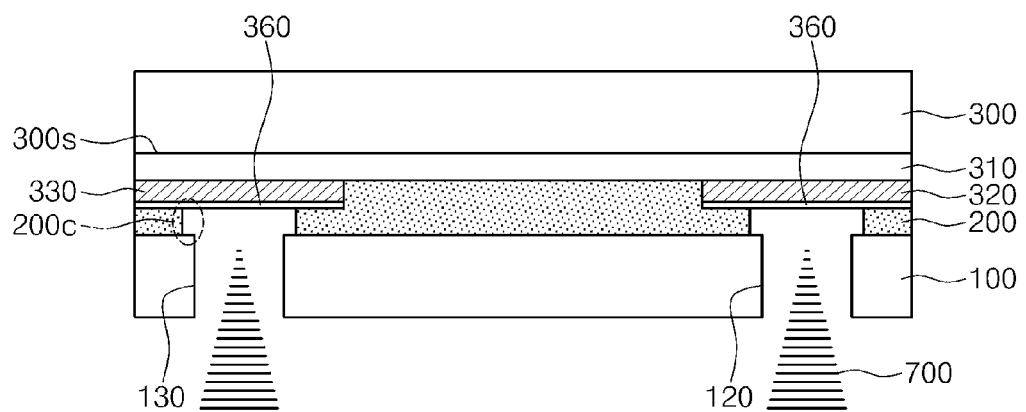
FIGS. 6A to 6C are cross-sectional views illustrating a method of fabricating a heterojunction structure of different substrates, according to a modification embodiment of the inventive concept.
Figure 6B:
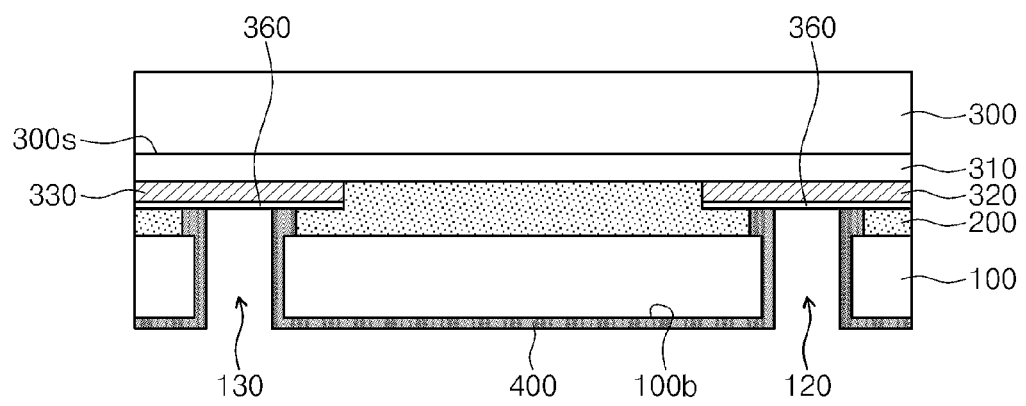
Figure 6C:
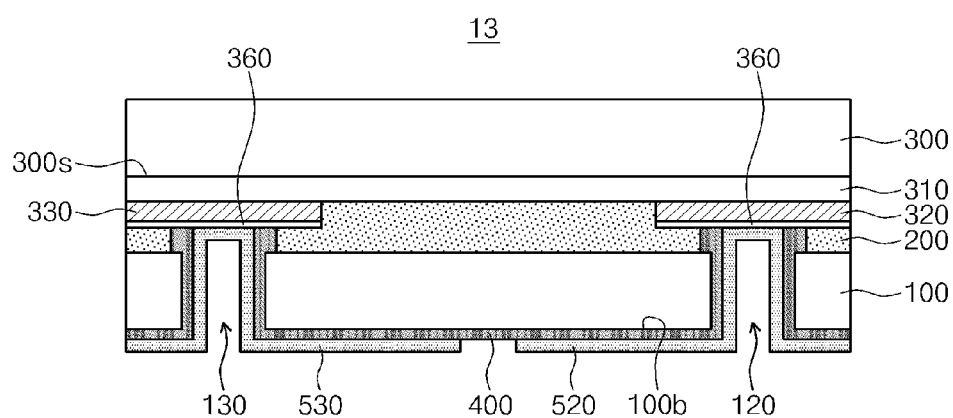

Modification 3 of Method of Fabricating Heterojunction Structure of Different Substrates FIGS. 6A to 6C are cross-sectional views illustrating a method of fabricating a heterojunction structure of different substrates, according to an embodiment of the inventive concept.

Referring to FIG. 6A, a silicon substrate 100 and a sapphire substrate 300 may be joined with an adhesive layer 200 of an organic material. First and second via holes 120 and 130 may be formed. The first and second via holes 120 and 130 may penetrate through the silicon substrate 100 and portions of the adhesive layer 200 to expose first and second electrode pads 320 and 330, respectively. The first and second via holes 120 and 130 may be formed in a drilling process using a laser 700. In the laser drilling process, the laser 700 may damage the first and second electrode pads 320 and 330. To prevent damage due to the laser 700, therefore, a laser stop layer 360 may be additionally formed on the first and second electrode pads 320 and 330. The laser stop layer 360 can protect the first and second electrode pads 320 and 330 from being damaged due to the laser 700. Also, the laser stop layer 360 may serve as a sacrificial layer when the laser 700 is irradiated, thereby protecting the first and second electrode pads 320 and 330. The laser stop layer 360 may be formed in a metal deposition process or a plating process. The adhesive layer 200, as illustrated in FIG. 2A, may have a bulk shape, or a patterned shape to have the through hole 220 as in FIG. 4A. The adhesive layer 200 may have an under-cut region 200c through irradiation of the laser 700.

Referring to FIG. 6B, an insulation layer 400, which covers side walls of the first and second via holes 120 and 130 and a lower surface 100b of the silicon substrate 100 and exposes the laser stop layer 360, may be formed by coating and patterning a layer of an organic material.

Referring to FIG. 6C, first and second connection electrodes 520 and 530 are connected to the first and second electrode pads 320 and 330 and also extended to the lower surface 100b of the silicon substrate 100. The first and second connection electrodes 520 and 530 may have the exposed laser stop layers 360 formed thereon. Therefore, there may be provided a heterojunction structure 13 of different substrates where the silicon substrate 100 and sapphire substrate 300 having different thermal expansion coefficients are joined by the adhesive layer 200 of an organic material. Except that the laser stop layer 360 is applied, the heterojunction structure 13 of different substrates according to another embodiment of the inventive concept may be the substantially same as the heterojunction structure 10 of FIG. 2E.

Figure 7A:
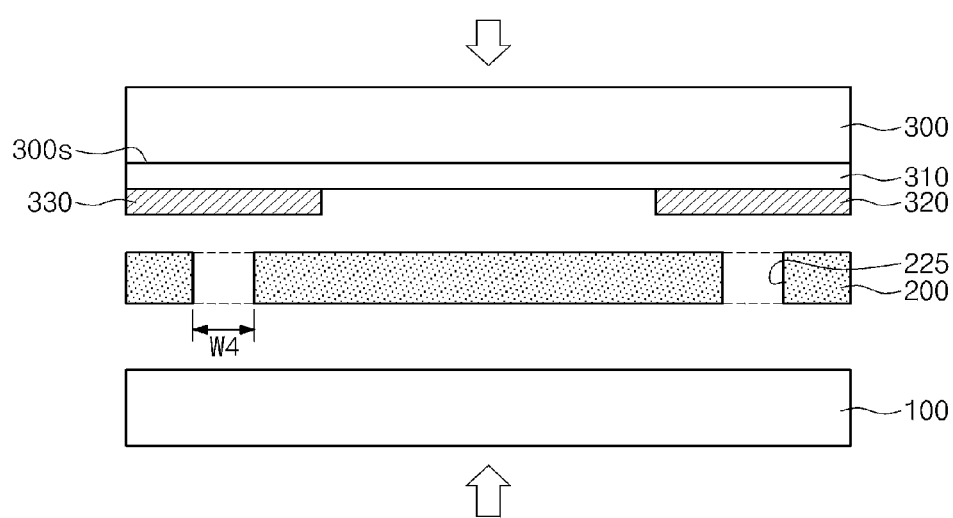
FIGS. 7A to 7C are cross-sectional views illustrating a method of fabricating a heterojunction structure of different substrates, according to another modification embodiment of the inventive concept.
Figure 7B:
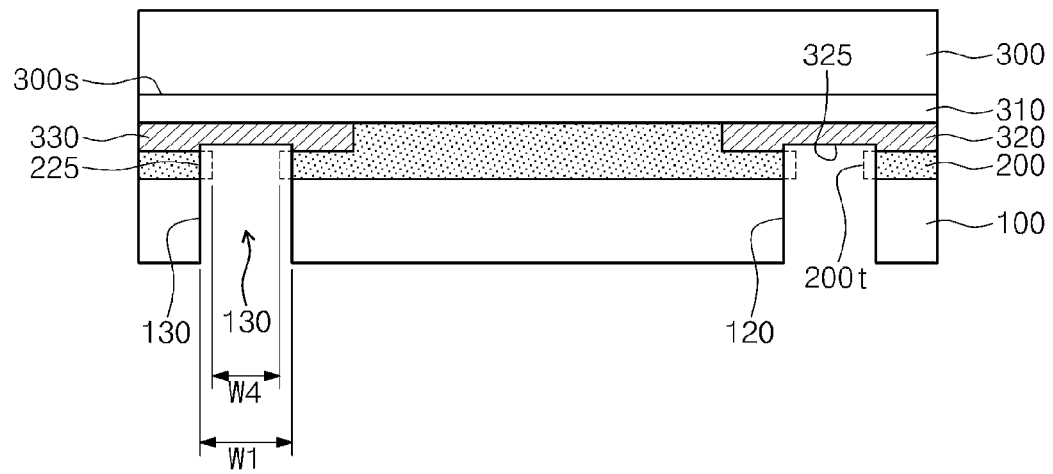
Figure 7C:
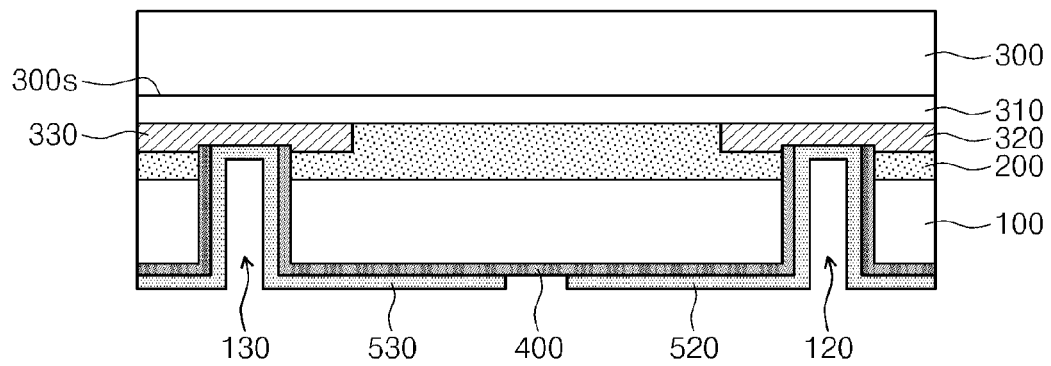

Modification 4 of Method of Fabricating Heterojunction Structure of Different Substrates FIGS. 7A to 7C are cross-sectional views illustrating a method of fabricating a heterojunction structure of different substrates, according to an embodiment of the inventive concept.

Referring to FIG. 7A, a silicon substrate 100 and a sapphire substrate 300 may be joined by an adhesive layer 200 of an organic material. The adhesive layer 200 may be patterned to have a plurality of through holes 225 having a fourth width W4 that are aligned with first and second electrode pads 320 and 330. The fourth width W4 may be less than a first width W1 described below for securing an etching margin.

Referring to FIG. 7B, first and second via holes 120 and 130 that expose the first and second electrode pads 320 and 330 through the silicon substrate 100 may be formed in a wet or dry etching process, respectively. The first and second via holes 120 and 130 may have the first width W1. In the etching process, an inner wall 200t of the through hole 225 may be further etched, and thus, a width of the through hole 225 may be increased from the fourth width W4 to the first width W1.

According to this embodiment, the through hole 225 of the adhesive layer 200 may be formed to have the fourth width W4 less than the first width W1, considering that the through hole 225 of the adhesive layer 200 is etched further when the first and second via holes 120 and 130 are formed. Therefore, the first and second via holes 120 and 130 may have the first width W1. Unlike other embodiments, an under-cut region may not be formed in the adhesive layer 200 region. In the etching process, the first and second electrode pads 320 and 330 may not be etched or slightly etched, and thus a plurality of recess regions 325 may be formed. As another example, the first and second via holes 120 and 130 may be formed by a laser drilling process. In this case, although not shown, the laser stop layer 360 (see FIG. 6A) may be further formed on the first and second electrode pads 320 and 330.

Referring to FIG. 7C, an insulation layer 400 of an organic material, which covers side walls of the first and second via holes 120 and 130 and a lower surface 100b of the silicon substrate 100 and exposes the first and second electrode pads 320 and 330, may be formed. According to the present embodiment, because an under-cut region, which could expose a sharp edge portion, e.g., 100s of FIGS. 1A and 1B, may not be formed in the adhesive layer 200 region, the insulation layer 400 can be prevented from undesirably (e.g., uncovering the sharp edge portion 100s of FIGS. 1A and 1B, serving as a source of a leakage current). Subsequently, first and second connection electrodes 520 and 530, which contact the exposed first and second electrode pads 320 and 330 and are extended to the lower surface 100b of the silicon substrate 100, may be formed, respectively. Therefore, there may be a heterojunction structure 14 of different substrates where the sapphire substrate 300 and silicon substrate 100 having different thermal expansion coefficients are joined by the adhesive layer 200 of an organic material and which has no under-cut region.

Application Example

Figure 8A:
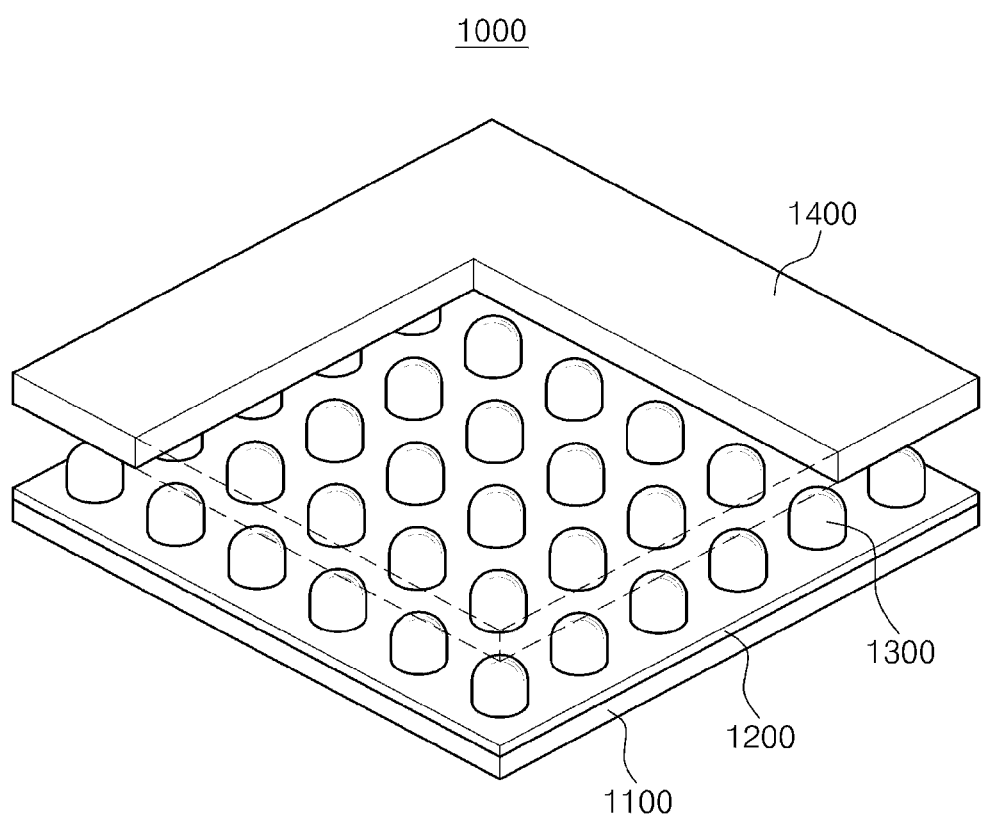
FIG. 8A is a perspective view illustrating a backlight unit of an LCD device including a light emitting device, according to embodiments of the inventive concept.
Figure 8B:
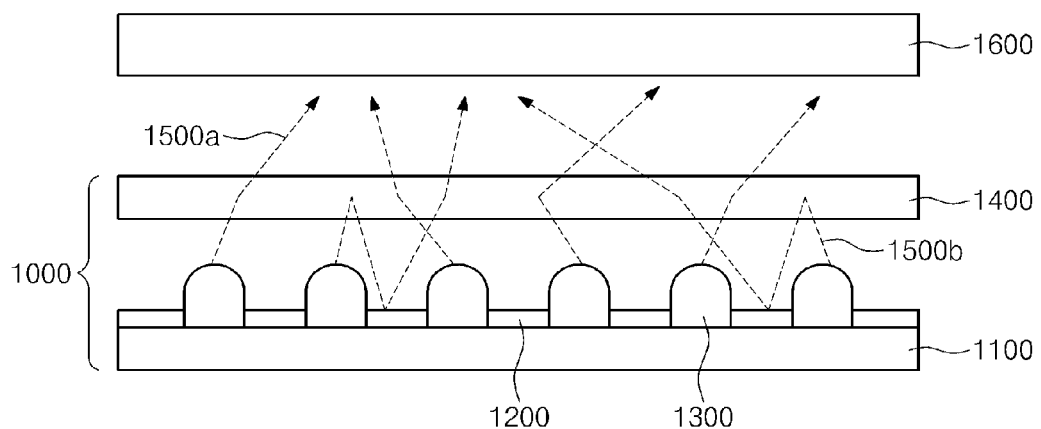
FIG. 8B is a cross-sectional view of the backlight unit of FIG. 8A.

FIG. 8A is a perspective view illustrating a backlight unit of an liquid crystal display (LCD) device including a light emitting device, according to embodiments of the inventive concept. FIG. 8B is a cross-sectional view of the backlight unit of FIG. 8A.

Referring to FIG. 8A, a backlight unit 1000 may include a light source 1300 producing light, a PCB 110 on which the light source 1300 is mounted, a light guide plate 1400 disposed over the light source 1300, and a reflector 1200 disposed on the PCB 1100. The light source 1300 may include the light emitting device chip 10a (not shown) or the light emitting device package 1 according to some embodiments of the inventive concept. The light source 1300 may include a red LED, a green LED, and a blue LED, or include a white LED. The PCB 1100 may include a circuit controlling light emission of the light source 1300. The light guide plate 1400 may be provided apart from the light source 1300 in order to conformally distribute light that is produced by the light source 1300. The light guide plate 1400 may be formed of transparent resin, for example, acrylic resin, polyurethane resin, and silicon resin.

Referring to FIG. 8B, light 1500a that is produced by the light source 1300 and passed through the light guide plate 1400 may be provided to the liquid crystal panel 1600, and thus a picture may be visually displayed on the liquid crystal panel 1600. Light 1500b that cannot pass through the light guide plate 1400 may be reflected to the PCB 1100, and again reflected by the reflector 1200 to travel to the light guide plate 1400.

The backlight unit 1000 may efficiently use light with the reflector 1200 and the light guide plate 1400, thereby obtaining high brightness. Like this embodiment, the backlight unit 1000 may be fabricated in a direct light type where the light source 1300 is disposed under the liquid crystal panel 1600. Unlike this, the backlight unit 1000 may be fabricated in an edge light type where the light source 1300 is disposed at one or more sides of the light guide plate 1400 and supplies light to the side surfaces of the light guide plate 1400 to guide light into the liquid crystal panel 1600.

According to some embodiments of the inventive concept, the substrates of different materials are joined by an adhesive layer of an organic material such as polymer. As a result, delamination, warpage and crack due to differences in the coefficients of thermal expansion between the substrates of different materials can be substantially reduced. Accordingly, the mechanical durability of the heterojunction structures of different substrates can be enhanced, and the yield of the fabrication method can increase. Furthermore, a good electrical connection between the different substrates can be possible, thereby improving electric characteristics of the device.

Figure 9:
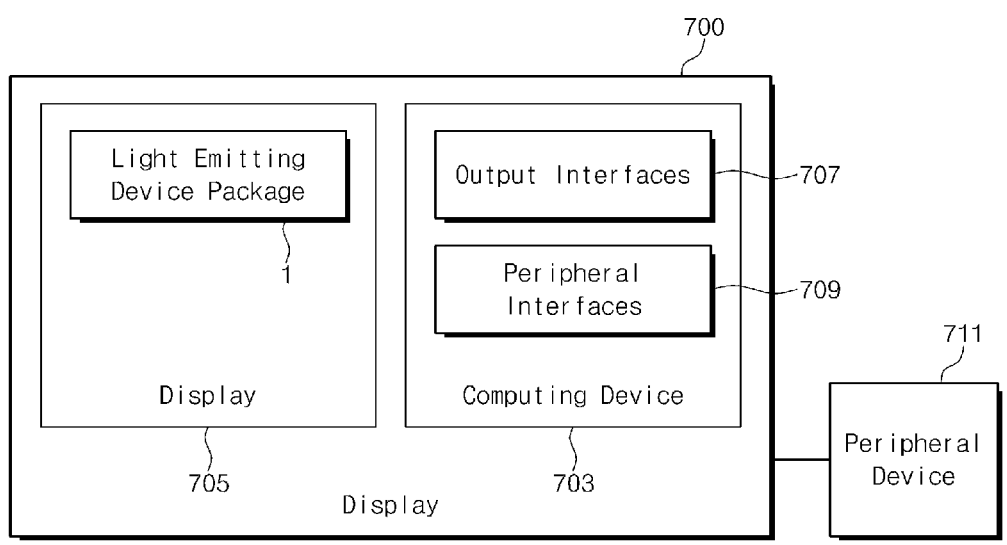
FIG. 9 illustrates a block diagram of a portion of a system arranged in accordance with an embodiment of the present disclosure.

FIG. 9 illustrates a block diagram of a portion of a system arranged in accordance with an embodiment of the present disclosure. As shown, the system 700 may include a display (e.g., LCD or AMOLED display) 705 and a computing device 703 such as a microprocessor.

In one embodiment, the display 705 and the computing device 703 of the system 700 may be implemented as a mobile electronic device such as a cell phone, a personal data assistant (PDA), a personal media player device, an application specific device, or a hybrid device that includes any of the above functions. The system 700 may also be implemented as a television (e.g., internet TV, Internet Protocol television (IPTV) or the like) or a personal computer such as a laptop computer or a desktop PC.

In one embodiment, the display 705 may include at least one light emitting device package 1 as described above with reference to, e.g., FIG. 1C.

In one embodiment, the computing device 703 may facilitate the display of the user interface and interacting with the display 705. For example, the computing device 703 may facilitate communication through various interface devices (e.g., output interfaces 707, peripheral interfaces 709, communication interfaces, or the like). Such output interfaces 707 may be configured to communicate to various devices including the display 705. The peripheral interfaces 709 may be employed to communicate with external devices included in and/or associated with the display 705, such as a touch input device (e.g., a touchpad).

In one embodiment, such output interfaces 707 and/or peripheral interfaces 709 may be included within the display 705. The system 700 may also include peripheral devices 711 such as a mouse, keyboard, printer, external Zip drive or scanner—or internal, such as a CD-ROM drive, CD-R drive or internal modem.

In some embodiments, a system comprising a computing device capable of providing a user interface; a display coupled in communication with the computing device, the display capable of displaying the user interface, the display including a light emitting device package that comprises a package substrate; a chip overlying the package substrate; a luminous layer joined to the chip by an adhesive layer interposed therebetween, an electrode pad formed on the luminous layer, the chip and the adhesive layer having a via hole penetrating therethrough to expose a region of the electrode pad; a connection electrode disposed in the via hole and contacting the electrode pad; and an insulation layer electrically insulating the connection electrode from the chip, where one of the chip and the luminous layer has a thermal expansion coefficient different than a thermal expansion coefficient of the other of the chip and the luminous layer, and where at least one of the adhesive layer or the insulation layer comprises an organic material.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.).

Various operations will be described as multiple discrete steps performed in a manner that is most helpful in understanding the invention. However, the order in which the steps are described does not imply that the operations are order-dependent or that the order that steps are performed must be the order in which the steps are presented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A heterojunction structure comprising:
   a first substrate;
   a second substrate comprising an electrode pad, the second substrate joined with the first substrate by an adhesive layer interposed between the first and second substrates, the first substrate and the adhesive layer having a via hole penetrating therethrough to expose a region of the electrode pad,
      wherein the via hole includes a first sub-via hole extending through the first substrate and having a substantially uniform first width, and wherein the via hole includes a second sub-via hole extending through a portion of the adhesive layer and having a second width greater than the first width;
   a connection electrode disposed, at least partially, in the via hole and contacting the electrode pad; and
   an organic insulation layer electrically insulating, at least in part, the connection electrode from the first substrate,
      wherein the first substrate has a thermal expansion coefficient different than a thermal expansion coefficient of the second substrate, and
      wherein the adhesive layer comprises an organic material.

2. The heterojunction structure of claim 1, wherein the connected electrode covers an inner wall of the via hole and extends from the inner wall of the via hole to a surface of the first substrate.

3. The heterojunction structure of claim 1, wherein: the electrode pad comprises first and second electrode pads, the via hole comprises first and second via holes respectively exposing corresponding regions of the first and second electrode pads, and the connection electrode comprises first and second connection electrodes respectively contacting the first and second electrode pads on respective inner walls of the first and second via holes.

4. The heterojunction structure of claim 1, wherein: the insulation layer covers an inner wall of the via hole and includes an opening that exposes the electrode pad, and the connection electrode covers the insulation layer and is extended to the opening and directly contacts the electrode pad.

5. The heterojunction structure of claim 1, wherein an under-cut region is formed in the adhesive layer between the electrode pad and the first substrate, and the under-cut region is defined by the second sub-via hole of the adhesive layer, wherein the second width of the second sub-via hole is larger than the first width of the first sub-via hole.

6. The heterojunction structure of claim 1, further comprising a luminous layer disposed on the second substrate and wherein the electrode pad is disposed on the luminous layer.

7. The heterojunction structure of claim 1, wherein the connection electrode has a substantially pillar shape.

8. The heterojunction structure of claim 1, further comprising a laser stop layer disposed on the electrode pad.

9. The heterojunction structure of claim 1,
wherein the second sub-via hole having a second width equal to the first width;
wherein the first sub-via hole includes a first sidewall and the second sub-via hole includes a second sidewall; and
wherein the insulation layer extends substantially vertically along both the first sidewall and the second sidewall.

10. A light emitting device package comprising:
a package substrate;
a chip overlying the package substrate;
a luminous layer joined with the chip by an adhesive layer interposed therebetween,
an electrode pad disposed on the luminous layer, the chip and the adhesive layer having a via hole penetrating therethrough to expose a region of the electrode pad,
wherein the via hole includes a first sub-via hole extending through the chip and having a substantially uniform first width, and wherein the via hole includes a second sub-via hole extending through a portion of the adhesive layer and having a second width greater than the first width;
a connection electrode disposed, at least partially, in the via hole and contacting the electrode pad; and
an organic insulation layer electrically insulating, at least in part, the connection electrode from the chip,
wherein the chip has a thermal expansion coefficient different than a thermal expansion coefficient of the luminous layer, and wherein the adhesive layer comprises an organic material.

11. The light emitting device package of claim 10, further wherein the connected electrode is electrically coupled with the package substrate.

12. The light emitting device package of claim 10, wherein the connection electrode covers at least a portion of the insulation layer and directly contacts the electrode pad through an opening of the insulating layer.

13. The light emitting device package of claim 10, further including an under-cut region disposed in the adhesive layer, and the under-cut region including at least a portion of the second sub-via hole of the adhesive layer, and
wherein the second width of the second sub-via hole is larger than the first width of the first sub-via hole.

14. The light emitting device package of claim 10, further including an under-cut region disposed in the adhesive layer, and the under-cut region including at least a portion of the second sub-via hole of the adhesive layer, and
wherein a portion of the insulation layer substantially fills the under-cut region.

15. A heterojunction structure comprising:
a first substrate;
a second substrate comprising an electrode pad, the second substrate joined with the first substrate by an adhesive layer interposed between the first and second substrates, the first substrate and the adhesive layer having a via hole penetrating therethrough to expose a region of the electrode pad,
a connection electrode disposed, at least partially, in the via hole and contacting the electrode pad; and
an organic insulation layer electrically insulating, at least in part, the connection electrode from the first substrate,
wherein the first substrate has a thermal expansion coefficient different than a thermal expansion coefficient of the second substrate,
wherein the adhesive layer comprises an organic material, and
wherein an under-cut region is formed in the adhesive layer between the electrode pad and the first substrate, and the under-cut region is defined by a first sub-via hole in a region of the adhesive layer having a width that is larger than width of a second sub-via hole in a region of the first substrate.

16. The heterojunction structure of claim 15, wherein the connected electrode extends from the electrode pad to a surface of the first substrate.

17. The heterojunction structure of claim 15, wherein at least a portion of the insulation layer substantially filling the under-cut region.

18. The heterojunction structure of claim 15, further comprising a luminous layer disposed between the first substrate and the second substrate.

* * * * *